United States Patent
Huang

(10) Patent No.: US 11,610,964 B2
(45) Date of Patent: Mar. 21, 2023

(54) CAPACITOR STRUCTURES FOR MEMORY AND METHOD OF MANUFACTURING THE SAME

(71) Applicant: Powerchip Semiconductor Manufacturing Corporation, Hsinchu (TW)

(72) Inventor: Kai-Jyun Huang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/838,285

(22) Filed: Jun. 13, 2022

(65) Prior Publication Data

US 2022/0310781 A1   Sep. 29, 2022

Related U.S. Application Data

(62) Division of application No. 17/202,301, filed on Mar. 15, 2021, now Pat. No. 11,393,897.

(30) Foreign Application Priority Data

Nov. 10, 2020   (TW) .................. 109139096

(51) Int. Cl.
  *H01L 21/00*   (2006.01)
  *H01L 49/02*   (2006.01)
  *H01L 27/108*  (2006.01)
(52) U.S. Cl.
  CPC ........ *H01L 28/92* (2013.01); *H01L 27/10808* (2013.01); *H01L 27/10852* (2013.01)

(58) Field of Classification Search
  CPC .............. H01L 28/92; H01L 27/10808; H01L 27/10852
  See application file for complete search history.

(56) References Cited

U.S. PATENT DOCUMENTS

| | | | |
|---|---|---|---|
| 6,204,108 B1 * | 3/2001 | Gau | ........................ H01L 28/91 438/238 |
| 2011/0124176 A1 | 5/2011 | Lim | |
| 2018/0151666 A1 | 5/2018 | Yew | |
| 2019/0123135 A1 | 4/2019 | Chang | |
| 2022/0069070 A1 | 3/2022 | Lai | |

* cited by examiner

*Primary Examiner* — Richard A Booth
(74) *Attorney, Agent, or Firm* — Winston Hsu

(57) ABSTRACT

A method of manufacturing a capacitor structure of memory, including forming a patterned photoresist layer on a hard mask layer and spacers on sidewalls of the patterned photoresist layer, perform a first etch process to remove uncovered hard mask layer so as to form first patterned hard mask layer and expose first portion of the dielectric layer, lowering a surface of the first portion of dielectric layer, perform a second etch process to remove uncovered first patterned hard mask layer so as to form second patterned hard mask layer and expose second portion of the dielectric layer, and performing a hole etching process to form first holes and second holes respectively in the first portion and the second portion of dielectric layer, wherein sidewalls of the first holes and second holes have wavelike cross-sections, and the wavelike cross-sections of first holes and second holes are shifted vertically by a distance.

10 Claims, 11 Drawing Sheets

CAPACITOR STRUCTURES FOR MEMORY AND METHOD OF MANUFACTURING THE SAME

CROSS REFERENCE TO RELATED APPLICATIONS

This application is a division of U.S. application Ser. No. 17/202,301, filed on Mar. 15, 2021. The content of the application is incorporated herein by reference.

BACKGROUND OF THE INVENTION

1. Field of the Invention

The present invention relates generally to capacitor structures for memory, and more specifically, to capacitor structures with wave-like cross-sections for memory and method of manufacturing the same.

2. Description of the Prior Art

A dynamic random access memory (DRAM) stores one bit of data using one transistor and one capacitor. Because the charge in the capacitor is lost over time, it must be periodically refreshed to maintain the contents stored in the memory, so it is called dynamic. The structure of DRAM is relatively simple, it uses only one transistor and one capacitor to store one bit of data, so its production cost is relatively low. In DRAM architecture, the capacitor is designed to be formed on the memory cell region and connected with the underlying transistor through a capacitor landing pad.

With the advance of generations, the density of integration and storage of DRAM gets higher and higher, accompanied by smaller and smaller device sizes and operating voltages. Accordingly, it is not easy to keep the capacitance of DRAM at an acceptable level. Designers have to figure out constantly how to increase the capacitance of storage nodes. Regarding this, the type of capacitor structure for memory is progressed from early concave-type structure to cylinder-type or pillar-type structure that can provide larger plate area. When the semiconductor technology node is advanced to be smaller than 25 nm, the capacitance level of common cylinder-type or pillar-type capacitor can no longer meet the requirement of current memory. Accordingly, how to further increase the plate area of capacitor structure is currently an urgent topic for those skilled in the art to endeavor and develop.

SUMMARY OF THE INVENTION

In view of the problem that capacitor structures for memory nowadays may have insufficient capacitance, the present invention hereby provides a novel manufacturing method to form capacitor structures with particular wave-like sidewalls to efficiently increase the plate area of capacitor structures, thereby improving the capacitance thereof.

One aspect of present invention is to provide a capacitor structure of memory, including a substrate, multiple cylindrical bottom electrode layers, wherein a bottom of each said bottom electrode layer contacts said substrate and extends vertically and upwardly from said substrate, and said cylindrical bottom electrode layer has a sidewall with wavelike cross-section, and said wavelike cross-sections of adjacent said bottom electrode layers are identical but shifted vertically by a distance, a capacitive dielectric layer on said bottom electrode layers, and a top electrode layer on said capacitive dielectric layer.

Another aspect of present invention is to provide a method of manufacturing a capacitor structure of memory, including steps of providing a substrate, and a dielectric layer and a hard mask layer is provided sequentially on said substrate, forming a patterned photoresist layer on said hard mask layer and spacers on sidewalls of said patterned photoresist layer, using said patterned photoresist layer and said spacers as an etch mask to perform a first etch process to remove uncovered said hard mask layer so as to form a first patterned hard mask layer and expose a first portion of said dielectric layer, etching exposed said first portion so that a surface of said first portion is lower than a surface of other portions of said dielectric layer, removing said patterned photoresist layer, using said spacers as an etch mask to perform a second etch process to remove uncovered said hard mask layer so as to form a second patterned hard mask layer and expose a second portion of said dielectric layer, wherein a surface of said second portion is higher than said surface of said first portion, and performing a hole etching process to form first holes and second holes respectively in said first portion and said second portion of said dielectric layer, wherein sidewalls of said first holes and said second holes have wavelike cross-sections, and said wavelike cross-sections of said first holes and said second holes are identical but shifted vertically by a distance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
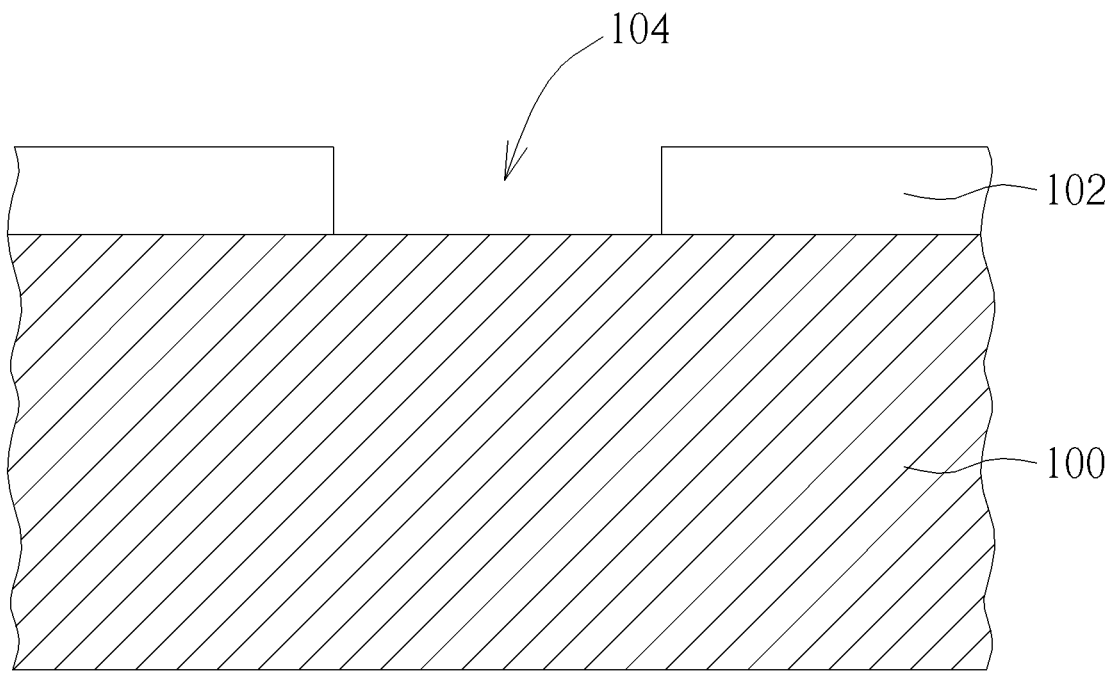
FIG. 1 to FIG. 5 are schematic cross-sectional views of a process for manufacturing holes with wave-like sidewalls in capacitor structures for memory in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

The objective of present invention is to provide a capacitor structure for memory with wave-like sidewalls and method of manufacturing the same, especially the cylinder-type or pillar-type DRAM capacitor structure. The embodiment of present invention places emphasis on how to form sidewalls with wave-like cross-sections and on the descriptions of relevant detailed features of capacitor structures. Please note that the concept and the principle of present invention may also be applied to the manufacture of other types of capacitor structures for memory and not limited in the types disclosed in the specification or drawings.

Please refer to FIG. 1 to FIG. 5, which illustrate schematic cross-sectional views of a process for manufacturing a hole with wave-like sidewall cross-section in a capacitor structure for memory in accordance with the preferred embodiment of the present invention. First, as shown in FIG. 1, a substrate 100 is provided for the hole with wave-like sidewall cross-sections to be formed therein. The substrate 100 may be a layer structure that can be easily removed, such as a silicon oxide layer. A patterned photoresist layer (or a patterned hard mask layer, such as a silicon nitride layer) 102 is then formed on the substrate 100. The patterned photoresist layer 102 is provided with an opening 104 to exposed a predetermined hole position on the substrate 100. The opening 104 may be formed by photolithography process, with a round shape preferably, but not limited thereto.

Figure 2:
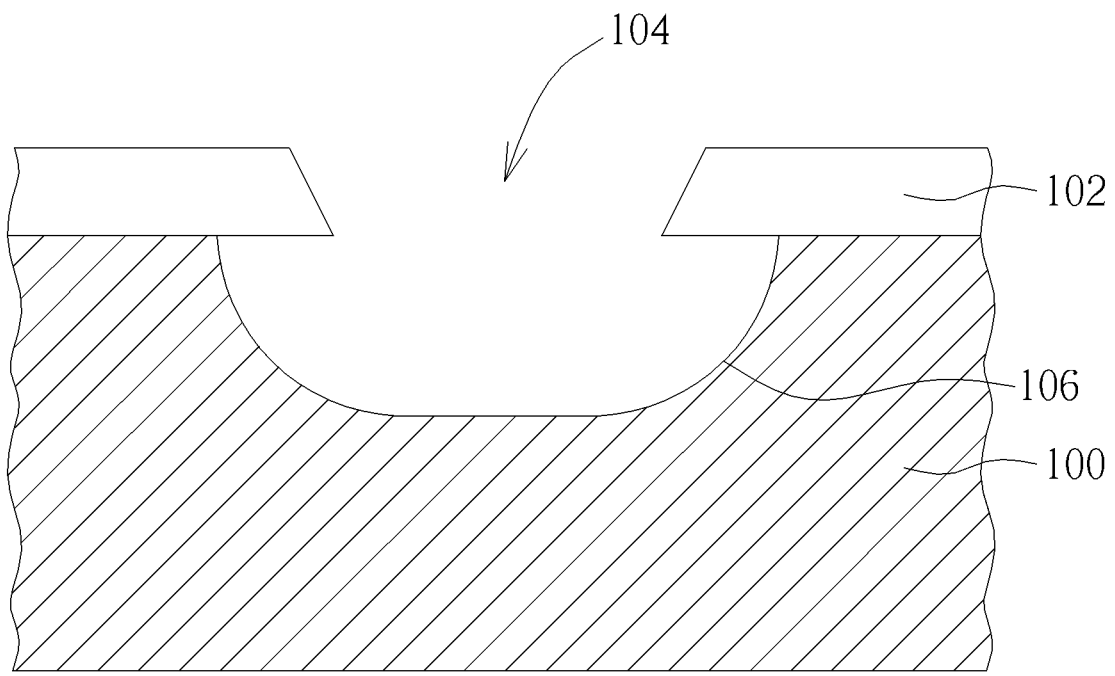

Next, please refer to FIG. 2. Use the patterned photoresist layer 102 as an etch mask to perform an etch process to etch the substrate 100 exposed from the opening 104, so as to form a recess 106 in the substrate 100. In the embodiment of present invention, the etch process is an isotropic dry etching process such as a Bosch deep reactive ion etching process, which etches the substrate 100 through the aeration of $SF_6$ gas. It is shown in the figure that the recess 106 formed by the etch process has undercut feature due to isotropic etching, wherein a part of the recess laterally extending under the patterned photoresist layer 102, thereby forming sidewalls with curved cross-sections. In the embodiment, the width and height of the recess 106 and the radian and length of the sidewalls may be controlled by tuning the parameters of etch process, so as to, preferably, make the characteristic of etch process primarily vertical etching and partially lateral etching.

Figure 3:
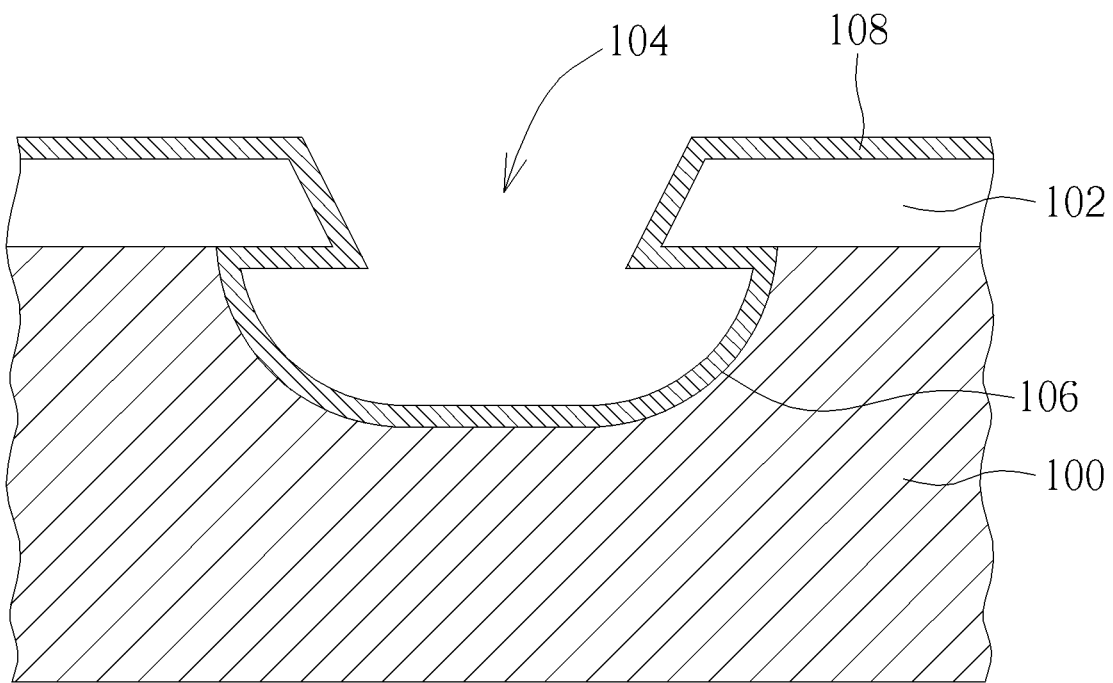

Next, please refer to FIG. 3. After the recess 106 is formed, a conformal polymer liner 108 is formed on surfaces of the recess 106 and the patterned photoresist layer 102. For example, a PFCs (perfluorinated compounds)-based polymer liner 108 may be formed on the surface of recess 106 through the aeration of C4F8 gas. In the embodiment, conformal polymer liner 108 may provide masking effect for lateral etching in later processes.

Figure 4:
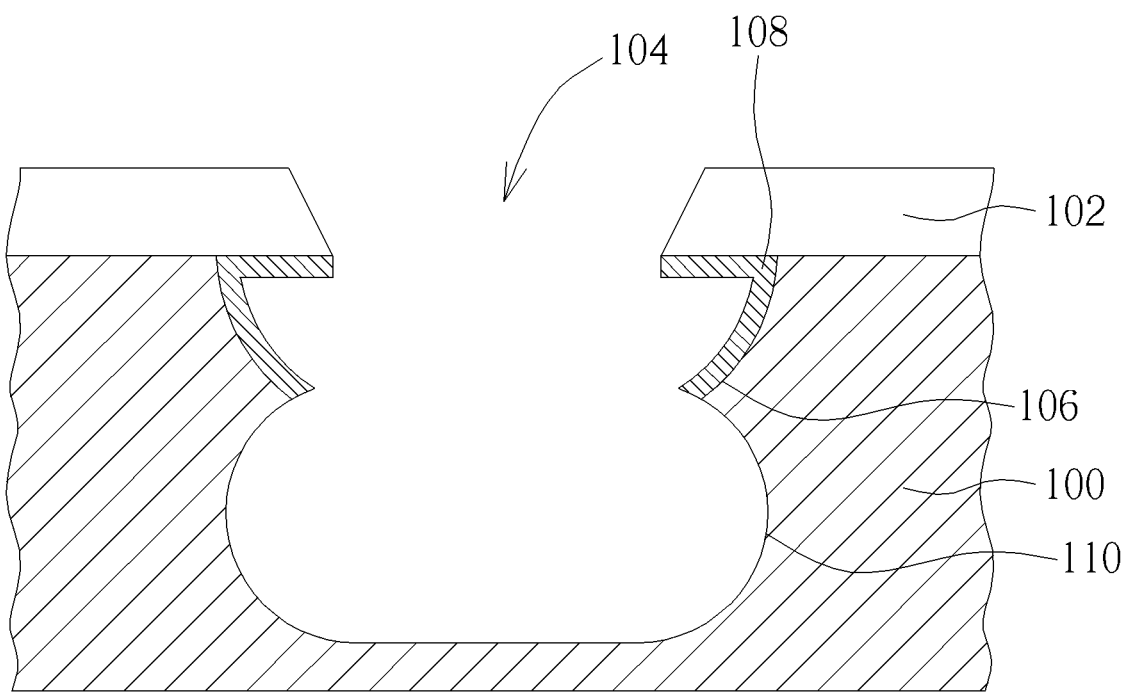

Next, please refer to FIG. 4. After the polymer liner 108 is formed, the etch process shown in FIG. 2 is then repeated, that is, using the patterned photoresist layer 102 as an etch mask to perform an isotropic dry etching process to etch the substrate 100. In the embodiment, since the characteristic of the etch process is primarily vertical etching, the bottom of recess 106 is etched through and another recess 110 is formed right under the recess 106 and vertically connected with the recess 106. The recess 110 formed in this etch process is also provided with curved cross-sections like the one of recess 106 since the etch process is partially lateral etching. In addition, the sidewall of previous recess 106 is masked by the polymer liner 108 so that it is not subject to the lateral etching, so that the width of recess 106 and the shape of its sidewalls are maintained.

Figure 5:
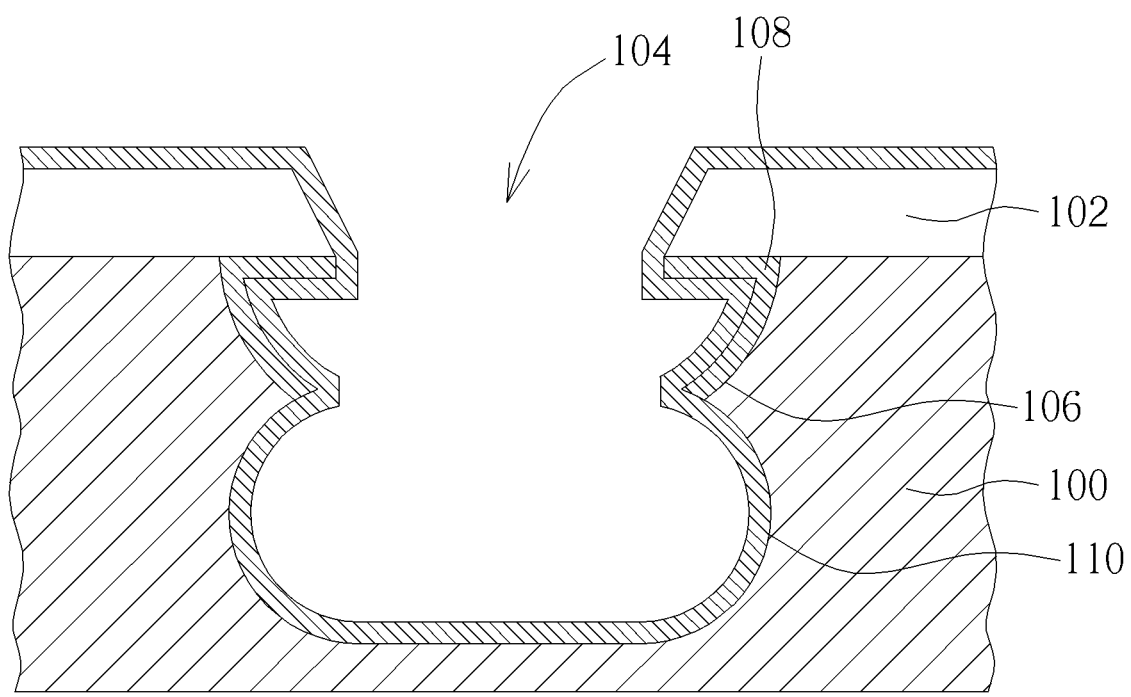

Next, please refer to FIG. 5. After the recess 110 is formed, the step shown in FIG. 3 is then repeated, that is, forming a polymer liner 108 again on surfaces of the recess 110 and the patterned photoresist layer 102, so as to provide masking effect for the lateral etching in later processes. In the embodiment of present invention, multiple continuous recesses may be formed through the repetition of the step shown in FIG. 3 (forming the polymer liner 108) and the step shown in FIG. 4 (recess etching). The vertically connecting recesses may constitute a vertical hole with wave-like sidewall cross-section as shown in FIG. 4. The sidewall with wave-like cross-section may provide more plate area in comparison to conventional sidewall with vertical, smooth cross-section, so that forming cylinder-type or pillar-type capacitor structure on this type of sidewall may efficiently increase the capacitance of memory. Please note that the aforementioned repeating steps may be conducted in single Bosch process through alternating aerations of difference process gases (ex. C4F8 gas and SF6 gas).

Figure 6:
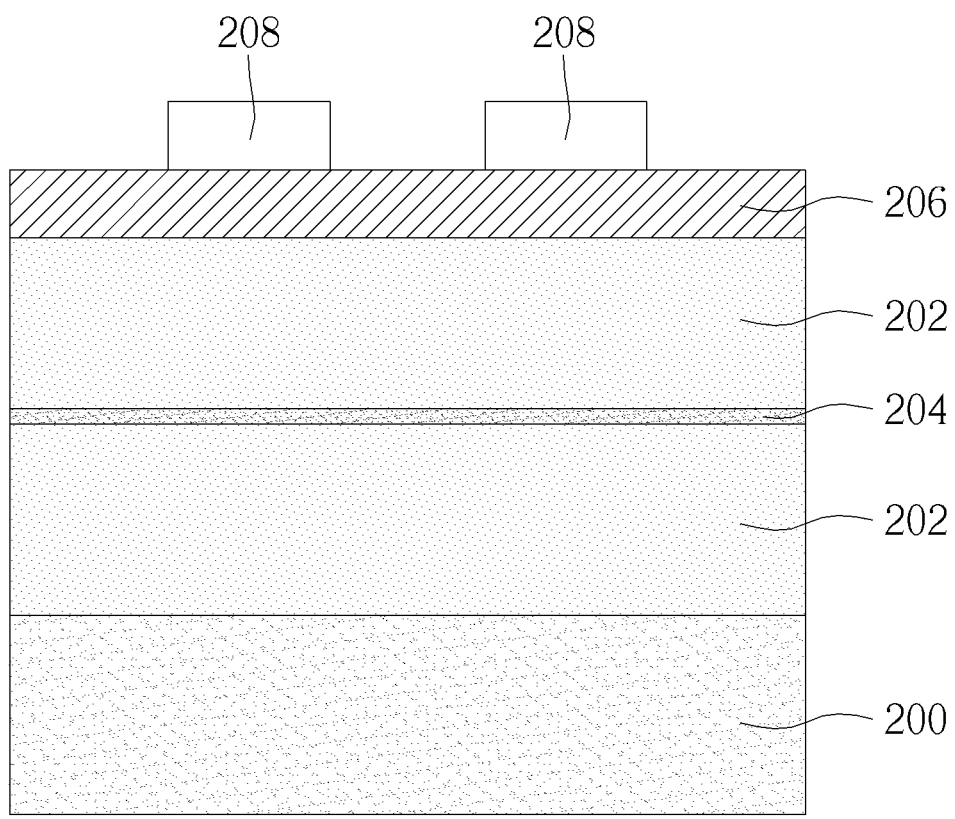
FIG. 6 to FIG. 20 are schematic cross-sectional views of a process using self-aligned double patterning (SADP) technology to manufacture capacitor structures for memory with multiple adjacent holes in accordance with the preferred embodiment of the present invention.

Please refer now to FIG. 6 to FIG. 20, which illustrate schematic cross-sectional views of a process using self-aligned double patterning (SADP) technology cooperating with aforementioned repeating steps to manufacture capacitor structures with multiple adjacent holes in accordance with the preferred embodiment of the present invention. First, as shown in FIG. 6, provide a silicon substrate 200 with predetermined structures such as active areas, sources/drains, access transistors, storage node contacts, bit line contacts, word lines and bit lines formed thereon. Since these structures are all conventional structures in common memory architecture and are not relevant to the key points of present invention, they will not be shown in the drawings and are represented by the substrate 200.

Refer again to FIG. 6. Layer structures like dielectric layer 202, hard mask layer 206 and patterned photoresist layer 208 are formed sequentially on the substrate 200, wherein a supporting layer 204 may be optionally formed in the middle of dielectric layer 202. The dielectric layer 202 is provided for holes with wave-like sidewall cross-sections to be formed therein, so it may be a layer structure that can be easily removed, such as a silicon oxide layer. The material of supporting layer 204 inside the dielectric layer 202 may be silicon nitride, which may become a supporting structure to provide structural support for the capacitor structures after the capacitor structures are manufactured. The patterns of patterned photoresist layer 208 are preferably, but not limited to, circular, and these circular patterns are formed at predetermined hole positions on the hard mask layer 206. The patterns of patterned photoresist layer 208 are spaced apart from each other by a predetermined spacing to facilitate the formation of spacers and the definition of desired double patterns in later SADP process. The defined patterns will then be transferred to underlying SiN-based hard mask layer 206. In the embodiment, the dielectric layer 202, the supporting layer 204 and the hard mask layer 206 may be formed by CVD process, and the patterned photoresist layer 208 may be formed by spin coating and photolithography processes.

Figure 7:
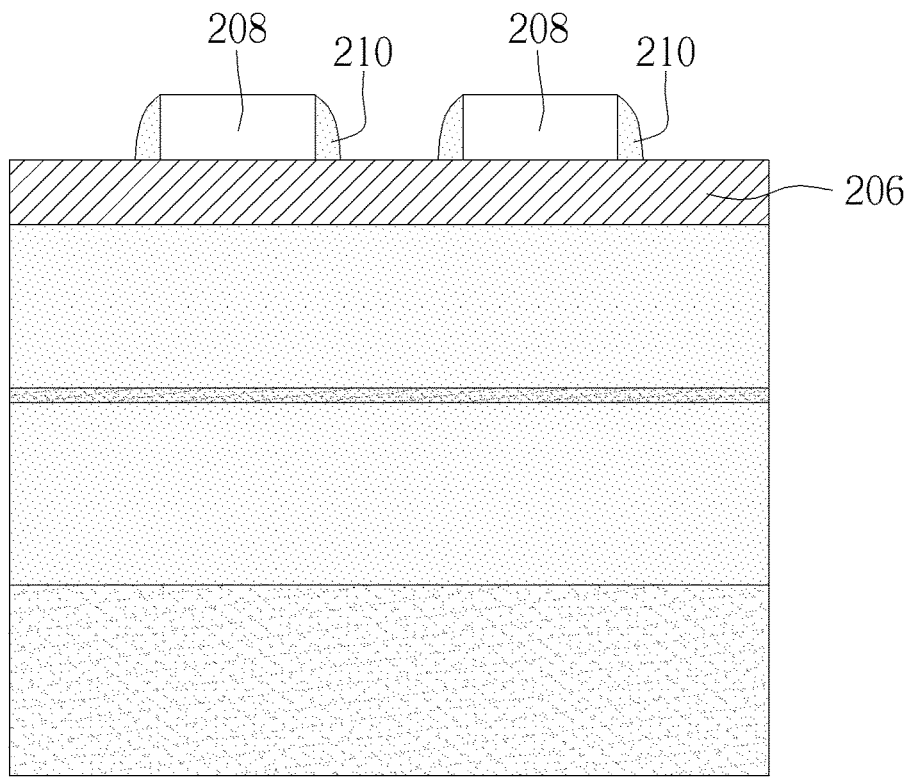

Next, please refer to FIG. 7. Spacers 210 are formed on sidewalls of the patterned photoresist layer 208. The spacers 210 surround the patterned photoresist layer 208 and define the double patterns required by the SADP process. In the embodiment of present invention, steps of forming the spacers 210 includes: first, forming a conformal spacer layer, such as a silicon oxide layer, with predetermined thickness on the patterned photoresist layer 208 and the hard mask layer 206. An etch back process is then performed to remove parts of the spacer layer until the patterned photoresist layer 208 and the hard mask layer 206 are exposed, so that the spacers 210 on sidewalls of the patterned photoresist layer 208 are formed.

Figure 8:
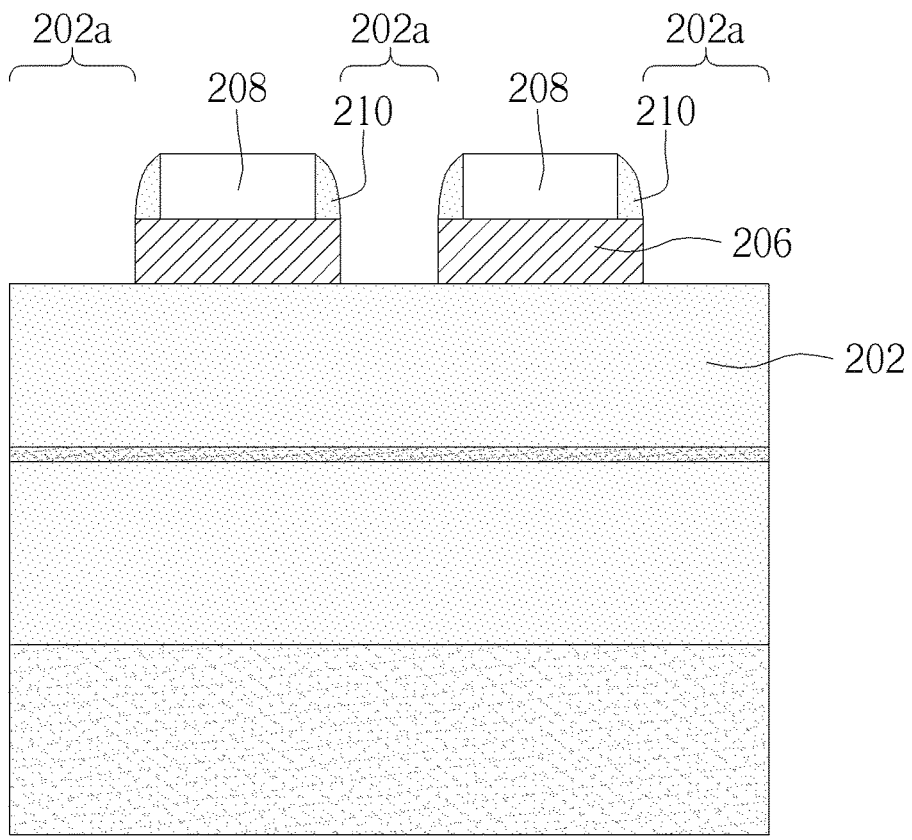

Next, please refer to FIG. 8. After the spacers 210 are formed, using the patterned photoresist layer 208 and the spacers 210 as an etch mask to perform a first dry etching process to etch underlying hard mask layer 206 (also referred as first patterned hard mask layer), so as to transfer the patterns of patterned photoresist layer 208 and spacers 210 to the hard mask layer 206 and expose a first portion 202a of the dielectric layer 202. This first portion 202a is the first pattern of double patterns in the SADP process.

Figure 9:
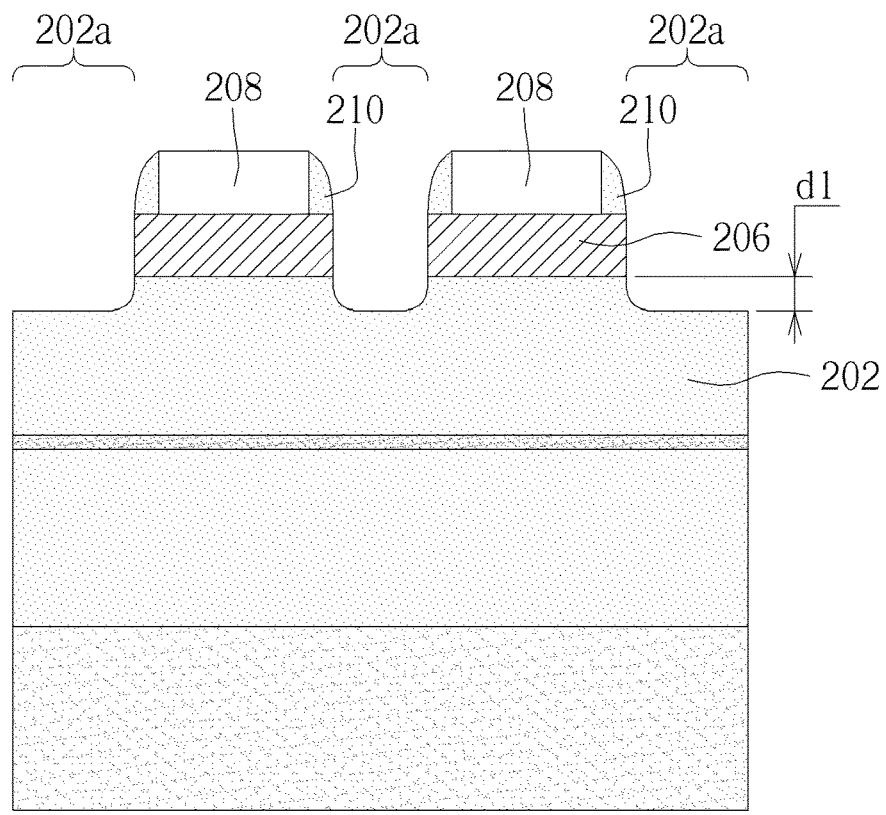

Next, please refer to FIG. 9. After the first portion 202a is exposed, an etch back process is then performed to etch the exposed first portion 202a of the dielectric layer 202, so that the surface of first portion 202a is lower than the surface of other portion of the dielectric layer 202. As shown in the figure, the surface of first portion 202a is lower than the surface of other portion by a height dl. The height dl may be determined depending on the processes and design requirement. This etch back process is an important feature of the present invention since it makes the double patterns formed in the SADP process having different levels, so as to achieve the purpose of vertically shifting by a distance between wave-like sidewall cross-sections of adjacent holes. Detailed description about this feature will be provided in later embodiments.

Figure 10:
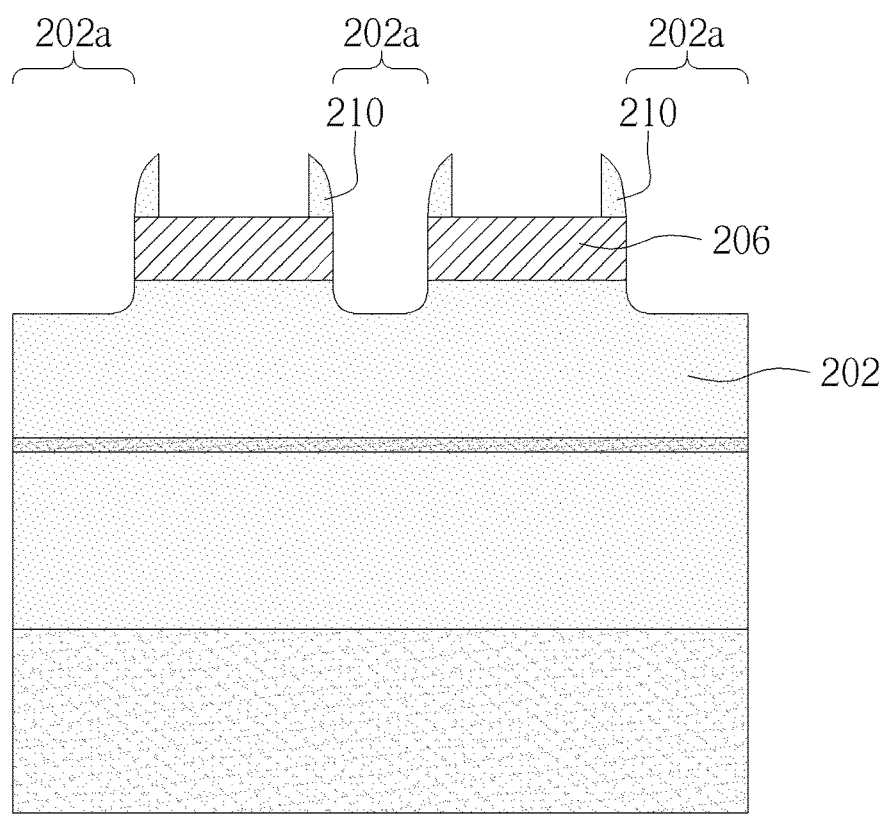

Next, please refer to FIG. 10. After the etch back process, the patterned photoresist layer 208 is then removed, so that only the spacers 210 remain on the first patterned hard mask layer 206. The patterned photoresist layer 208 may be removed by an asking process. After the patterned photoresist layer 208 is removed, the portion exposed from the hard mask layer 206 is the second pattern of double patterns in the SADP process.

Figure 11:
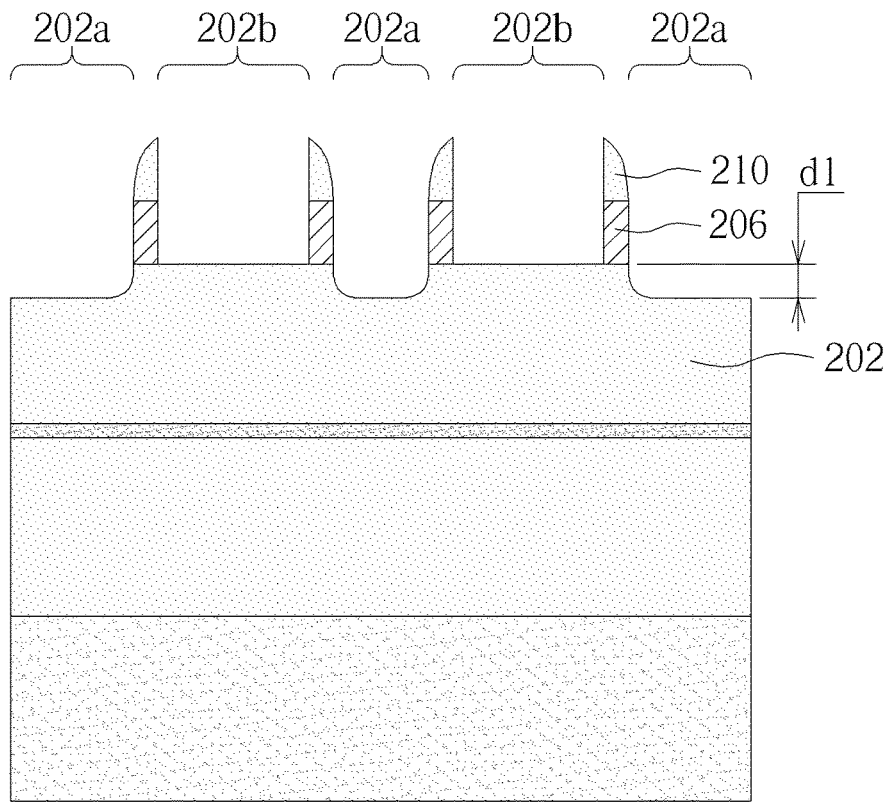

Next, please refer to FIG. 11. After the patterned photoresist layer 208 is removed, use the spacers 210 as an etch mask to perform a second dry etching process to etch the exposed hard mask layer 206, so as to transfer the pattern of spacers 210 to the hard mask layer 206 (also referred as second patterned hard mask layer) and expose a second portion 202b of the dielectric layer 202. Through the two dry etching processes, the hard mask layer 206 with the pattern of spacers 210 are formed on the dielectric layer 202, and the patterns divide the dielectric layer 202 into alternating first portion 202a and second portion 202b, wherein the surface of second portion 202b is higher than the surface of first portion 202a. In the embodiment of present invention, adjacent capacitor structures will be formed in the defined first portion 202a and second portion 202b of the dielectric layer 202, and sidewalls of these adjacent capacitor structures will be provided with the vertically shifting feature. Detailed description about this feature will be provided in later embodiments.

Figure 12:
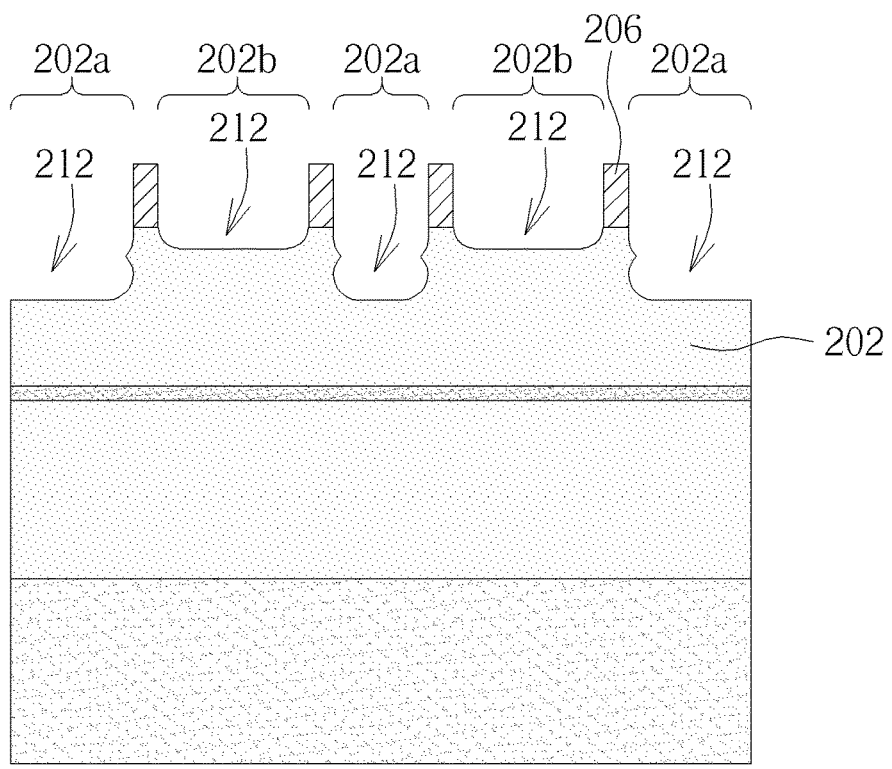

Next, please refer to FIG. 12. After the second portion 202b of dielectric layer 202 is exposed, the second patterned hard mask layer 206 is then used as an etch mask to perform an etch process to simultaneously etch the first portion 202a and the second portion 202b of dielectric layer 202, so as to form recesses 212 in the dielectric layer 202. This step is similar to the aforementioned embodiment of FIG. 2, which uses an isotropic dry etching process to form the recesses 212 with undercut feature as shown in FIG. 12. The difference is that in this embodiment, since the first portion 202a and the second portion 202b have a height difference dl before the etch process, it can be seen in the figure that the depth of recesses 212 formed in the first portion 202a is greater than the depth of recesses 212 formed in the second portion 202b at this stage.

Figure 13:
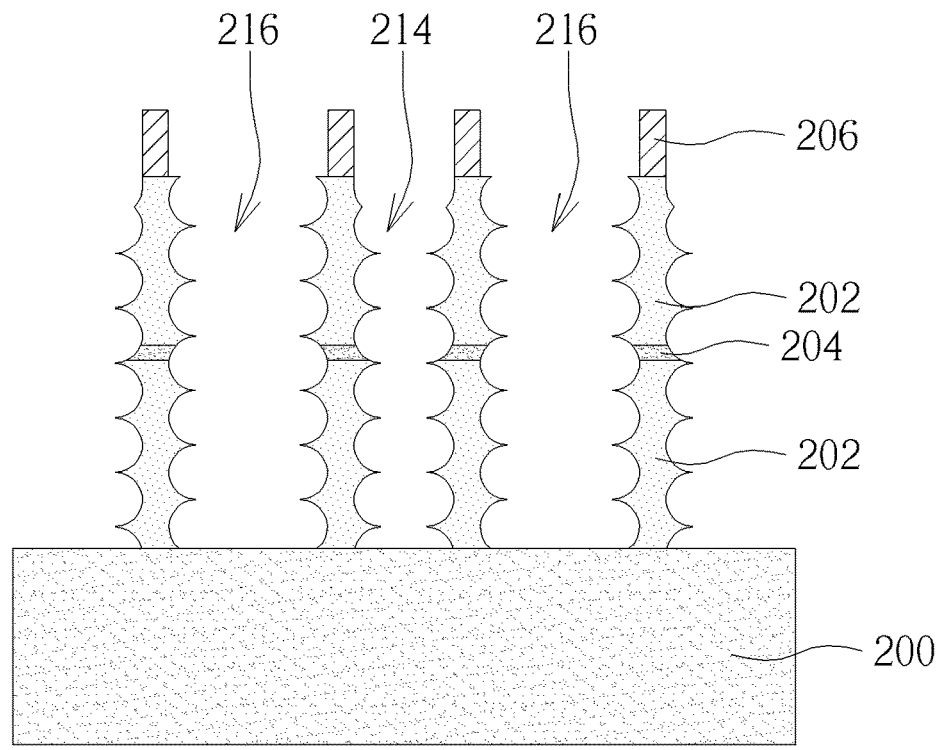

Next, please refer to FIG. 13. Through the repetition of the step of forming polymer liner in FIG. 3 and the step of recess etching, multiple continuous recesses may be formed as shown in the figure. These vertically connecting recesses constitute vertical holes 214/216 with wave-like sidewall cross-sections, and the wave-like sidewall is made up of multiple continuous arcs. The holes 214/216 would extend through the middle supporting layer 204 and the underlying dielectric layer 202 to the substrate 200. Since they are formed in the same process, the sidewalls of first holes 214 formed in the first portion of the dielectric layer 202 and the sidewalls of second holes 216 formed in the second portion of the dielectric layer 202 would have the same sidewall cross-sections. However, since a height difference exists between the first portion 202a and the second portion 202b before the etch process, the wavelike cross-sections of first holes 214 and second holes 216 are shifted vertically from each other by a distance. Please note that in the embodiment of present invention, the first holes 214 and the second holes 216 may be formed on the surface of substrate in staggered arrangements.

Figure 21:
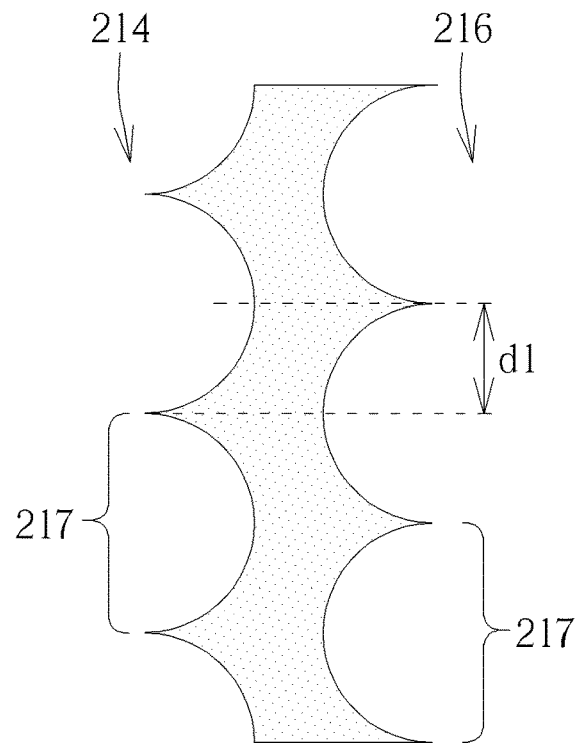
FIG. 21 is an enlarged schematic cross-sectional view of a sidewall of a hole in capacitor structures for memory in accordance with the preferred embodiment of the present invention.

The aforementioned shifting wave-like sidewall cross-sections are shown more clearly in the enlarged drawing of FIG. 21. It can be seen that the sidewall of first hole 214 on the left side and the sidewall of second hole 216 on the right side have identical wave-like cross-sections, but the arcs 217 constituting the wave-like cross-sections are shifted vertically from each other by a height dl. The shifting height dl is exactly the height difference preformed by the etch back process to the first portion 202a of the dielectric layer as shown in the embodiment of FIG. 9.

In relevant prior arts, the laterally adjacent capacitor recesses always have completely opposite, non-shifted arc patterns. Regarding the memory design nowadays with extremely high storage node density, the dielectric layer at the closest position of arcs between two adjacent holes is quite thin. The dielectric layer between adjacent recesses may be easily etched through due to process variation, thereby causing short-circuit of capacitor structures formed in later process. The shifting design and "dislocation" between adjacent wave-like cross-sections may vertically stagger the positions of adjacent recesses so as to prevent the joint of laterally extending arc surfaces caused by the etch process when they are getting too close.

Figure 22:
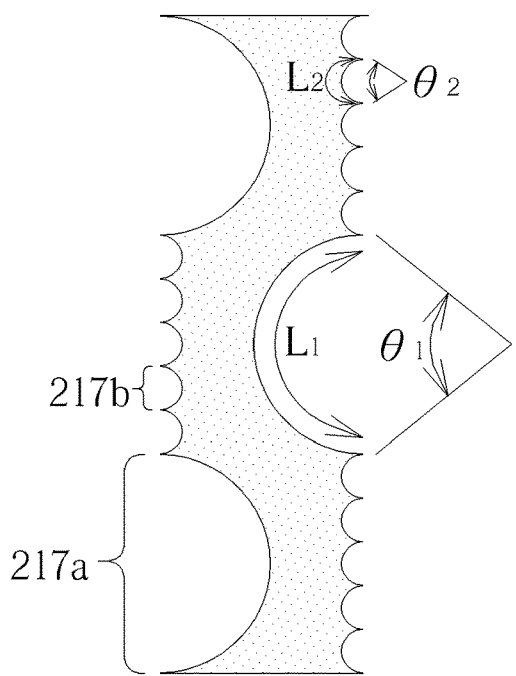
FIG. 22 is an enlarged schematic cross-sectional view of a sidewall of a hole in capacitor structures for memory in accordance with another embodiment of the present invention.

In the embodiment of present invention, since the width and height of recess 212 and the radian and length of its sidewalls may be determined by tuning parameters of the etch process, there might be different designs for the wave-like cross-sections of the holes. Please refer to FIG. 22, which is an enlarged schematic cross-sectional view of a sidewall of the hole in capacitor structures for memory in accordance with another embodiment of the present invention. It can be seen in the figure that the arcs constituting a wave-like cross-section in the same hole may have at least two different lengths and at least two different radians. The length $L_1$ and radians $\theta_1$ of larger arc 217a are greater than the length $L_2$ and radians $\theta_2$ of smaller arc 217b respectively. Multiple continuous smaller arcs 217b in one hole may correspond to a larger arc 217a in adjacent hole. According to the above concept, the sidewalls of holes in the present invention may be provided with various wave-like cross-sections, which are not limited to the ones shown in the embodiments and figures.

Figure 14:
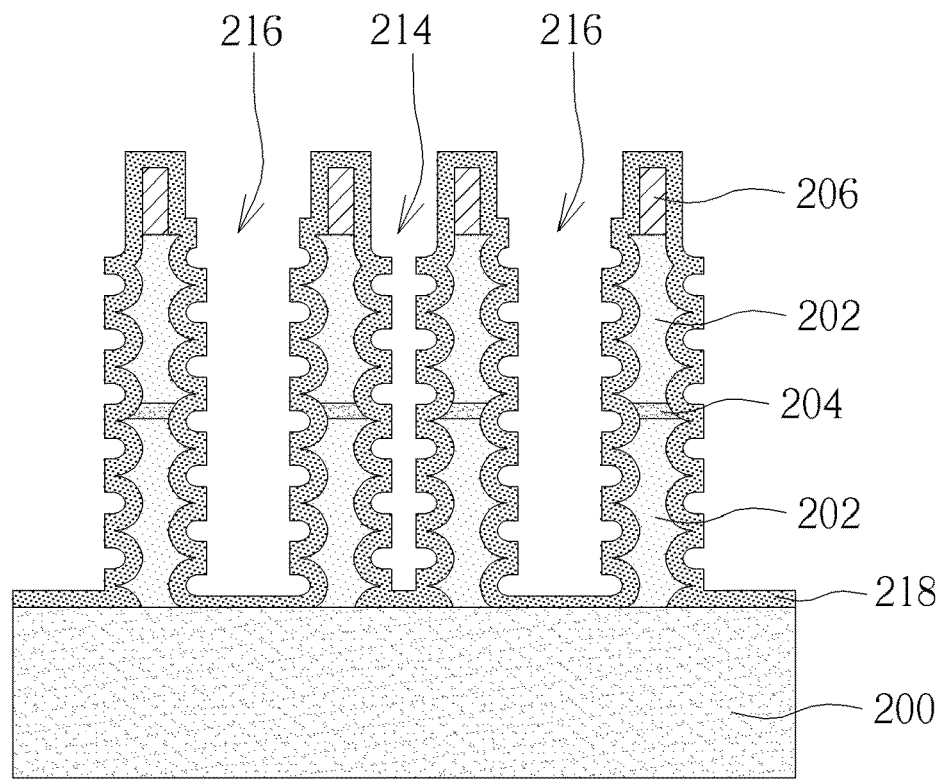

Back to the process flow of manufacturing the capacitor structure, please refer to FIG. 14. After the first holes 214 and the second holes 216 are formed, a conformal bottom electrode layer 218 is formed on the surface of first holes 214 and second holes 216. The bottom electrode layer 218 would cover the surface of remaining hard mask layer 206 and dielectric layer 202 and contacts the underlying substrate 200, for example, contacts the pad portion of the capacitor preformed on the substrate 200. The bottom electrode layer 218 may be formed by CVD process with materials like titanium nitride.

Figure 15:
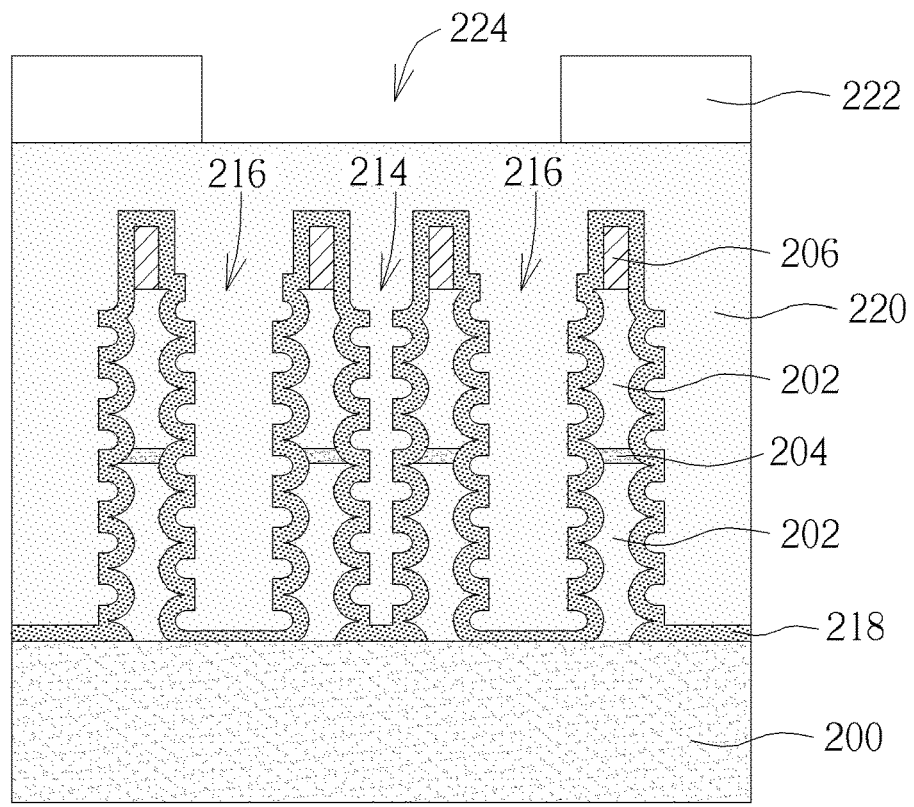

Next, please refer to FIG. 15. After the bottom electrode layer 218 is formed, a planarization layer 220 is then covered on the bottom electrode layer 218 and fills up the first holes 214 and the second holes 216. The material of planarization layer 220 may be SiCOH or SiOC formed by flowable CVD (FCVD) with excellent gap-filling characteristic to provide a flat process surface. After the planarization layer 220 is formed, a patterned photoresist layer 222 is then formed on the planarization layer 220 with openings 224 to expose parts of the planarization layer 220. The positions of the openings preferably overlap parts of the hard mask layer 206 and the supporting layer 204, so as to facilitate the removal of these portions in later process.

Figure 16:
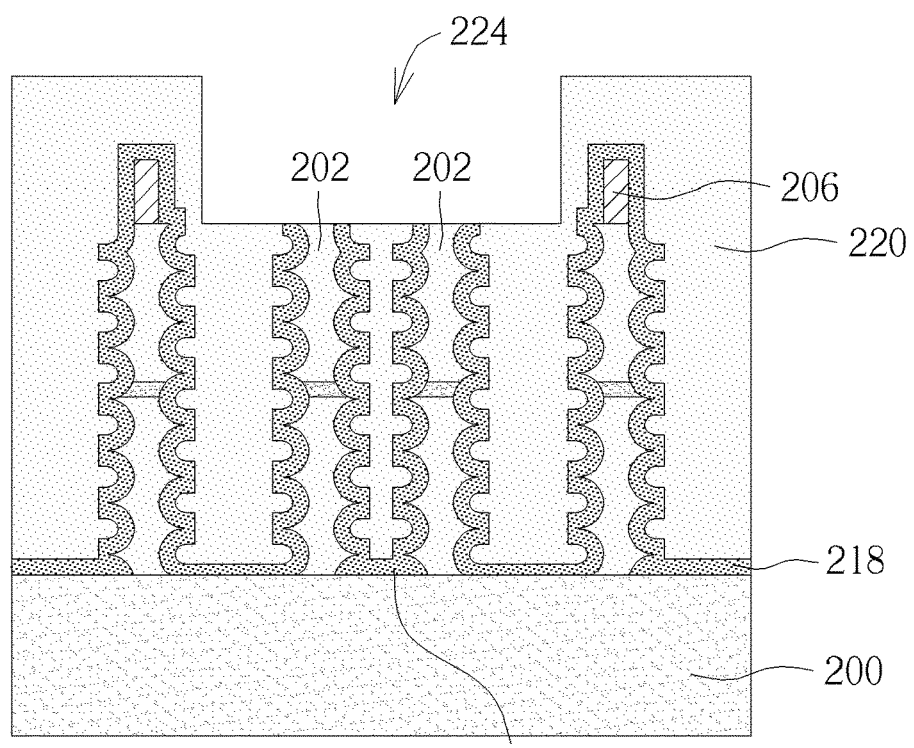

Next, please refer to FIG. 16. Use the patterned photoresist layer 222 as an etch mask to perform a dry etching process to remove the hard mask layer 206, the planarization layer 220 and parts of the bottom electrode layer 218 right under the openings 224. The etch process would divide once continuous bottom electrode layer 218 into different capacitor units and expose the dielectric layer 202 therebetween. It is shown in the figure that, in this embodiment, the bottom electrode layer 218a in the first hole 214 becomes an individual bottom electrode portion in a cylindrical shape, with a bottom contacting the substrate 200 and extending vertically and upwardly therefrom and with wave-like sidewall cross-sections.

Figure 17:
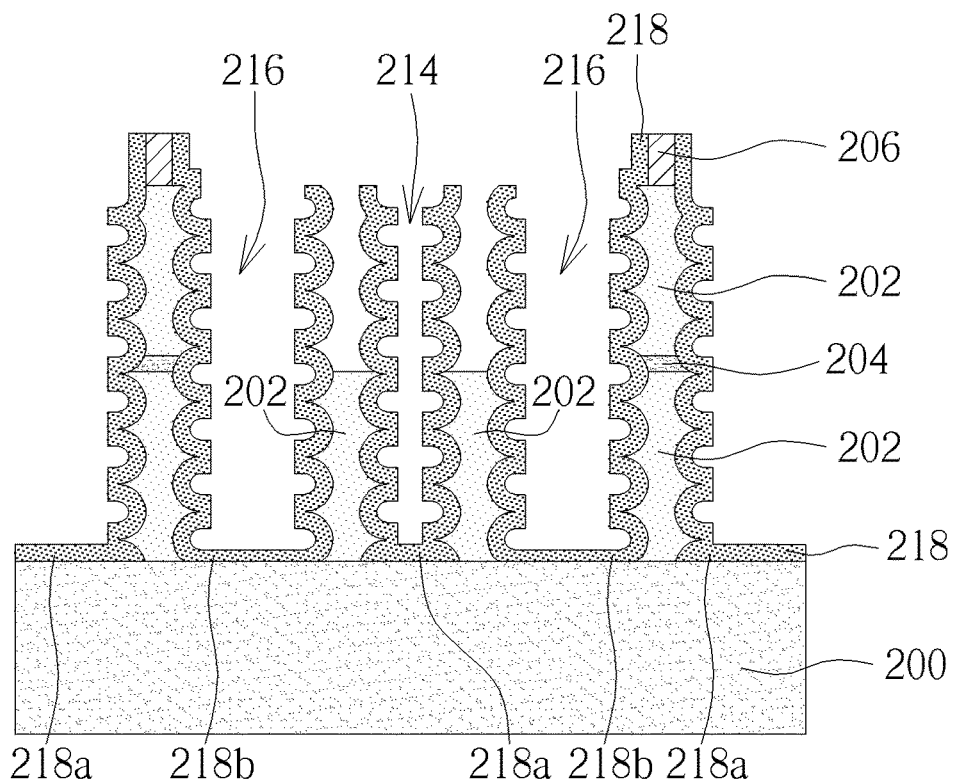

Next, please refer to FIG. 17. Conduct the first phase of cylindrical electrode releasing process, which may include a step of performing a dry etching process to remove the exposed dielectric layer 202 and the planarization layer 220, so that parts of the sidewalls of bottom electrode layer 218 are exposed. In the case that a supporting layer 204 is provided in the dielectric layer, this step may further include performing another dry etch process to remove the supporting layer 204 exposed from the dielectric layer 202. Parts of the bottom electrode layer 218 and parts of the remaining hard mask layer 206 may be removed at the same time to divide the bottom electrode layer 218 again into different capacitor units, like individual bottom electrode layers 218b in the second holes 216 shown in the figure.

Figure 18:
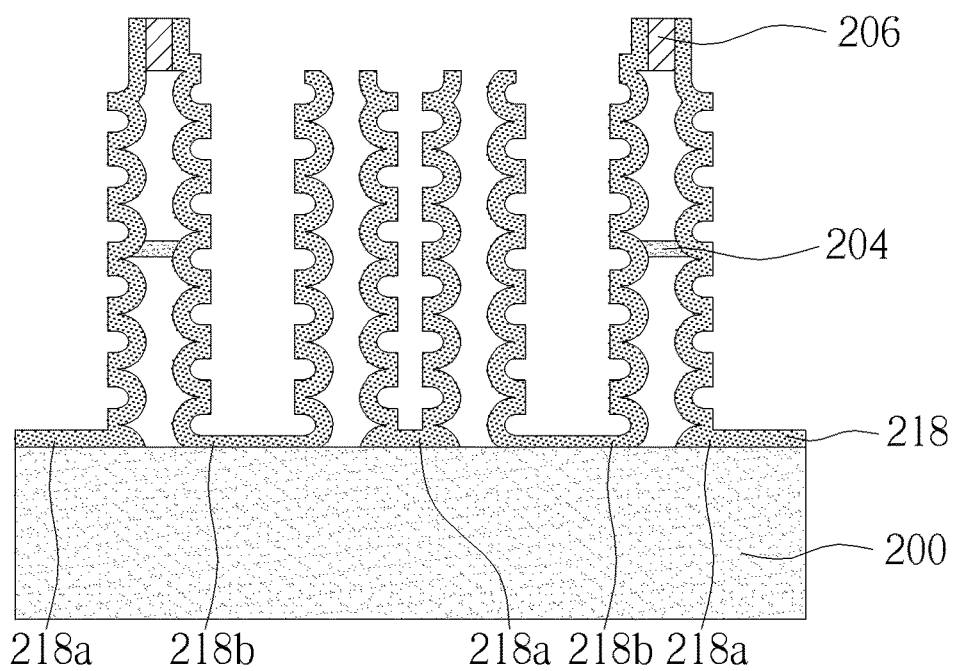

Next, please refer to FIG. 18. After the first phase of cylindrical electrode releasing process, the second phase of cylindrical electrode releasing process is then performed, which may include a step of wet etching process, ex. using HF etchant, to remove remaining dielectric layer 202, so that the sidewalls of cylindrical bottom electrodes may be completely exposed. Please note that the hard mask layer 206 and the supporting layer 204 between the bottom electrode layers 218a and 218b are not removed in this etch process. Therefore, the remaining hard mask layer 206 and the supporting layer 204 may function as a supporting structure between adjacent bottom electrode layers 218a and 218b, wherein the hard mask layer 206 and the supporting layer 204 respectively connect the middles and the tops of the adjacent bottom electrode layers to prevent collapse and short-circuit of the capacitor structures. It can be seen in the figure that adjacent bottom electrode layers 218a and 218b have identical sidewall cross-sections, but shifted vertically from each other by a distance.

Figure 19:
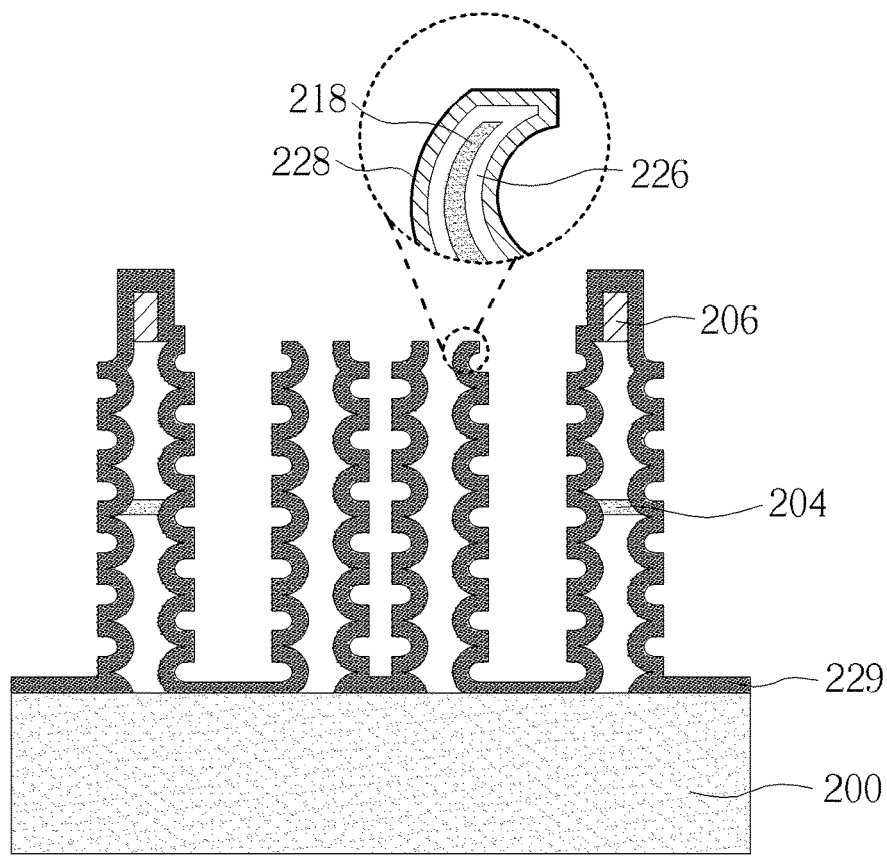

Next, please refer to FIG. 19. After the cylindrical electrode releasing process, a capacitive dielectric layer 226 and a top electrode layer 228 are formed sequentially on the surface of expose bottom electrode layer 218 (please see the partial enlarged drawing). The material of capacitive dielectric layer 226 may be high-k material, such as aluminum oxide, zirconium oxide or the alternating layer stack thereof, formed conformally on the surface of bottom electrode layer 218 by atomic layer deposition (ALD), but not limited thereto. For the clarity and simplicity of drawings, a capacitor stack 229 is used to represent the capacitor portion made up of the bottom electrode layer 218, the capacitive dielectric layer 226 and the top electrode layer 228 in later figures. In the embodiment of present invention, the capacitive dielectric layer 226 and the top electrode layer 228 are formed along the surface of cylindrical bottom electrode layer 218. Since the bottom electrode layers have wave-like sidewall cross-sections, it may provide greater plate area in comparison to conventional vertical, smooth sidewall cross-sections, to meet the capacitance requirement of current small-scale memory with high storage node density.

Figure 20:
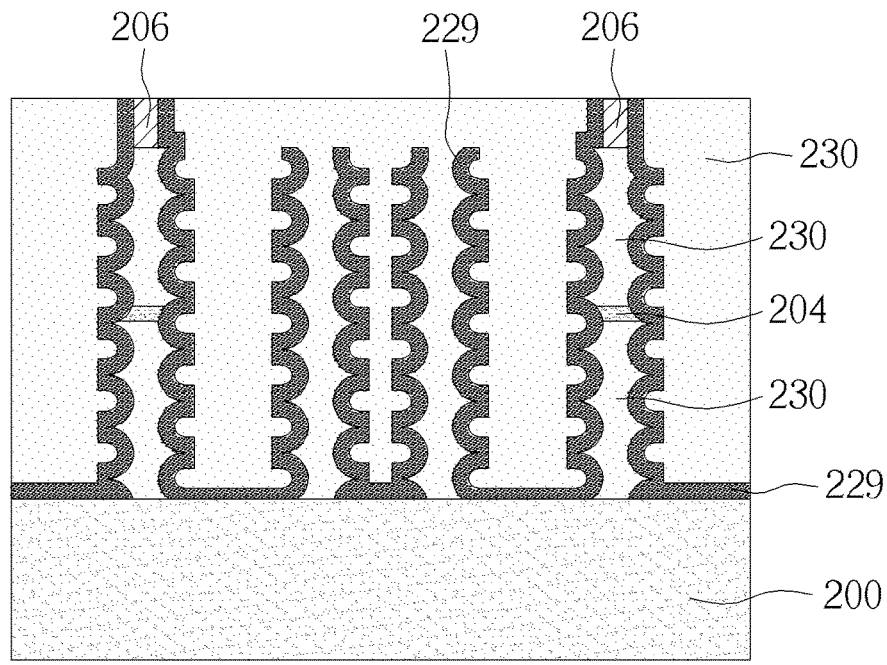

Next, please refer to FIG. 20. After the capacitive dielectric layer 226 and the top electrode layer 228 are formed, a conductive layer 230 is then formed on the top electrode layer 228 (represented by the capacitor stack 229 in the figure) to cover the capacitor structures and spaces therebetween. The material of conductive layer 230 may be Si, SiGe or SiP, formed on the surface of top electrode layer 228 in the capacitor stack 229 by LPCVD and filling the gaps between the capacitor stacks 229. The conductive layer 230 may be further doped with elements like boron or phosphorus to improve its electrical performance. In the embodiment of present invention, a planarization process may be further performed to remove parts of the conductive layer 230, so as to expose remaining hard mask layer 206 and divide the capacitive dielectric layer 226 and the top electrode layer 228 for different capacitor units.

After the conductive layer 230 is formed, other photolithography processes may be performed to pattern the capacitor structures, form top plates and remove unnecessary capacitor portions on the peripheral region. Since the key point of present invention focuses on the process flow of manufacturing capacitor structures, the aforementioned later processes and the portions formed in these processes will not be described and illustrated herein to prevent the obscure of the focuses of present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a capacitor structure of memory, comprising:
   providing a substrate, and a dielectric layer and a hard mask layer is provided sequentially on said substrate;
   forming a patterned photoresist layer on said hard mask layer and spacers on sidewalls of said patterned photoresist layer;
   using said patterned photoresist layer and said spacers as an etch mask to perform a first etch process to remove uncovered said hard mask layer so as to form a first patterned hard mask layer and expose a first portion of said dielectric layer;
   lowering a surface of said first portion of said dielectric layer;
   removing said patterned photoresist layer;
   using said spacers as an etch mask to perform a second etch process to remove uncovered said first patterned hard mask layer so as to form a second patterned hard mask layer and expose a second portion of said dielectric layer, wherein a surface of said second portion of said dielectric layer is higher than said surface of said first portion of said dielectric layer; and
   performing a hole etching process to form first holes and second holes respectively in said first portion and said second portion of said dielectric layer, wherein sidewalls of said first holes and said second holes have wavelike cross-sections, and said wavelike cross-sections of said first holes and said second holes are shifted vertically by a distance.

2. The method of manufacturing a capacitor structure of memory of claim 1, wherein said wavelike cross-section is made up of multiple continuous arcs, and said arcs have at least two different lengths and at least two different radians.

3. The method of manufacturing a capacitor structure of memory of claim 1, wherein said first holes and said second holes expose underlying said substrate, and further comprising forming a bottom electrode layer on surfaces of said second patterned hard mask layer, said first holes, said second holes and said substrate.

4. The method of manufacturing a capacitor structure of memory of claim 3, further comprising removing a portion of said second patterned hard mask layer and a portion of said dielectric layer after forming said bottom electrode layer so as to form multiple cylindrical said bottom electrode layers extending vertically and upwardly from said substrate.

5. The method of manufacturing a capacitor structure of memory of claim 4, wherein steps of removing at least a portion of said second patterned hard mask layer and said dielectric layer further comprises:
   forming a planarization layer covering said bottom electrode layer;
   performing a photolithography process to remove a portion of said planarization layer, a portion of said bottom electrode layer and a portion of said second patterned hard mask layer and expose a portion of said dielectric layer; and
   completely removing said dielectric layer.

6. The method of manufacturing a capacitor structure of memory of claim 5, wherein said dielectric layer further comprises a supporting layer, and said step of completely removing said dielectric layer further comprises:
   removing said supporting layer, wherein said un-removed dielectric layer and said un-removed supporting layer which are right under said remaining portion of said second patterned hard mask layer function as a supporting structure to connect two adjacent said bottom electrode layers.

7. The method of manufacturing a capacitor structure of memory of claim 4, further comprising forming a capacitive dielectric layer and a top electrode layer sequentially on said bottom electrode layers.

8. The method of manufacturing a capacitor structure of memory of claim 7, further comprising forming a conductive layer on said top electrode layer.

9. The method of manufacturing a capacitor structure of memory of claim 1, wherein steps of forming said spacers on said patterned photoresist layer comprises:
   forming a conformal spacer layer on said patterned photoresist layer and said hard mask layer; and
   performing an etch back process to remove a portion of said spacer layer until said patterned photoresist layer and said hard mask layer are exposed, so as to form said spacers on sidewalls of said patterned photoresist layer.

10. The method of manufacturing a capacitor structure of memory of claim 1, wherein said hole etching process comprises:

using said second patterned hard mask layer as an etch mask to perform a third etch process to form recesses respectively in said first portion and said second portion of said dielectric layer, wherein said recesses have curved sidewall cross-sections;

forming a conformal polymer liner on surfaces of said recesses and said second patterned hard mask layer;

using said polymer liner as a lateral etch mask to perform a fourth etch process, so as to form another recess right under each said recess; and repeating steps of forming said conformal polymer liner and said fourth etch process to form multiple vertically connecting said recesses, and said vertically connecting recesses respectively constitute said first holes and said second hole.

* * * * *